(12) United States Patent
Liu et al.

(10) Patent No.: US 9,601,593 B2
(45) Date of Patent: Mar. 21, 2017

(54) SEMICONDUCTOR DEVICE STRUCTURE AND METHOD FOR FORMING THE SAME

(71) Applicant: Taiwan Semiconductor Manufacturing Co., Ltd, Hsin-Chu (TW)

(72) Inventors: Ke-Chih Liu, Hsinchu (TW); Chia-Ming Tsai, Zhubei (TW); Shih-Chi Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/455,512

(22) Filed: Aug. 8, 2014

(65) Prior Publication Data
US 2016/0043186 A1 Feb. 11, 2016

(51) Int. Cl.
| | |
|---|---|
| *H01L 29/40* | (2006.01) |
| *H01L 29/66* | (2006.01) |
| *H01L 29/78* | (2006.01) |
| *H01L 21/768* | (2006.01) |
| *H01L 29/49* | (2006.01) |
| *H01L 29/51* | (2006.01) |

(Continued)

(52) U.S. Cl.
CPC .... *H01L 29/6656* (2013.01); *H01L 21/76814* (2013.01); *H01L 21/76831* (2013.01); *H01L 21/76832* (2013.01); *H01L 21/76834* (2013.01); *H01L 21/76897* (2013.01); *H01L 29/665* (2013.01); *H01L 29/66545* (2013.01); *H01L 29/66628* (2013.01); *H01L 29/66636* (2013.01); *H01L 29/7848* (2013.01); *H01L 21/28518* (2013.01); *H01L 29/165* (2013.01); *H01L 29/4966* (2013.01); *H01L 29/517* (2013.01)

(58) Field of Classification Search
CPC ..... H01L 27/06; H01L 21/02; H01L 21/8234; H01L 29/423; H01L 29/76; H01L 29/40; H01L 29/66; H01L 29/78; H01L 29/408; H01L 29/6656; H01L 29/7813; H01L 29/407; H01L 29/42368; H01L 29/41766; H01L 29/4236; H01L 29/7835; H01L 29/0696
USPC ........................ 257/267, 401, 410, 334, 337
See application file for complete search history.

(56) References Cited

U.S. PATENT DOCUMENTS

| | | | |
|---|---|---|---|
| 6,835,618 B1 * | 12/2004 | Dakshina-Murthy et al. | 438/256 |
| 2003/0032273 A1 * | 2/2003 | Tseng | H01L 27/11521 438/594 |
| 2006/0189053 A1 * | 8/2006 | Wang et al. | 438/197 |

(Continued)

*Primary Examiner* — Chuong A Luu
(74) *Attorney, Agent, or Firm* — Birch, Stewart, Kolasch & Birch, LLP

(57) ABSTRACT

A semiconductor device structure is provided. The semiconductor device structure includes a semiconductor substrate. The semiconductor device structure includes a gate stack positioned over the semiconductor substrate. The gate stack includes a gate dielectric layer and a gate electrode over the gate dielectric layer. The semiconductor device structure includes spacers positioned over first sidewalls of the gate stack. The spacers and the gate stack surround a recess. The semiconductor device structure includes an insulating layer formed over the semiconductor substrate and surrounding the gate stack. The semiconductor device structure includes a cap layer covering the insulating layer, the spacers, and inner walls of the recess.

20 Claims, 9 Drawing Sheets

(51) Int. Cl.
*H01L 29/165* (2006.01)
*H01L 21/285* (2006.01)

(56) References Cited

U.S. PATENT DOCUMENTS

| | | | |
|---|---|---|---|
| 2006/0199321 A1* | 9/2006 | Lo | H01L 29/458 |
| | | | 438/197 |
| 2010/0320544 A1* | 12/2010 | Tseng et al. | 257/380 |
| 2012/0217553 A1* | 8/2012 | Luo | H01L 21/823807 |
| | | | 257/288 |
| 2013/0299921 A1 | 11/2013 | Chang et al. | |
| 2015/0021683 A1* | 1/2015 | Xie | H01L 29/6653 |
| | | | 257/330 |

* cited by examiner () SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since the feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
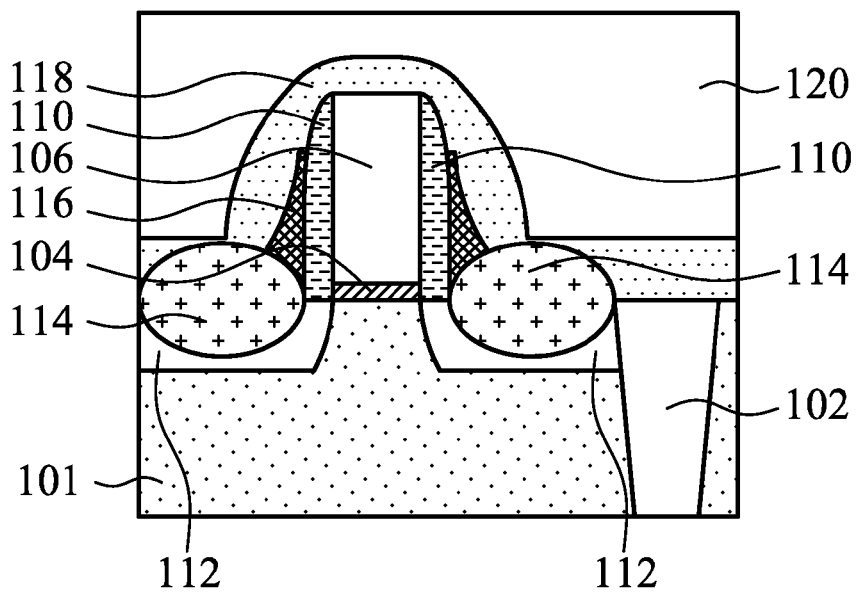
FIGS. 1A-1N are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figure 1B:
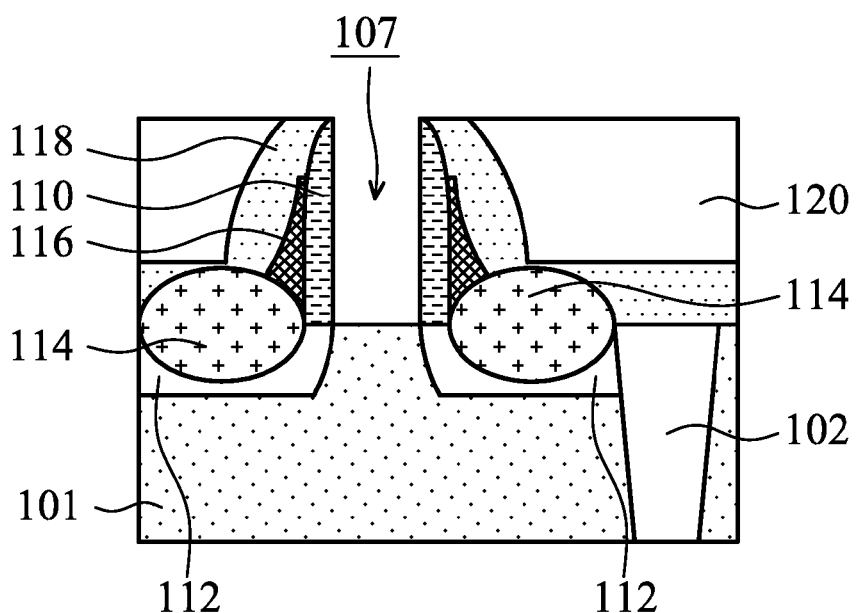
Figure 1C:
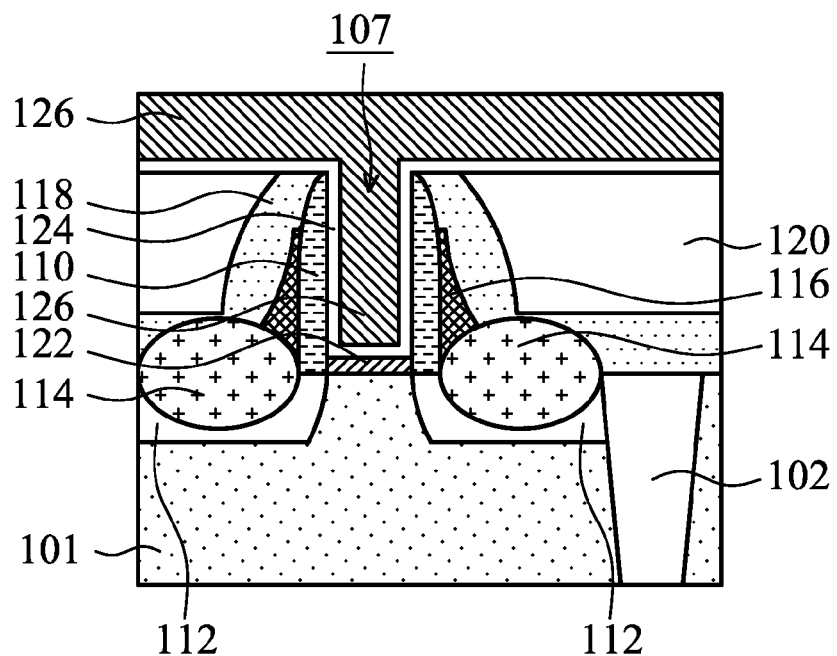
Figure 1D:
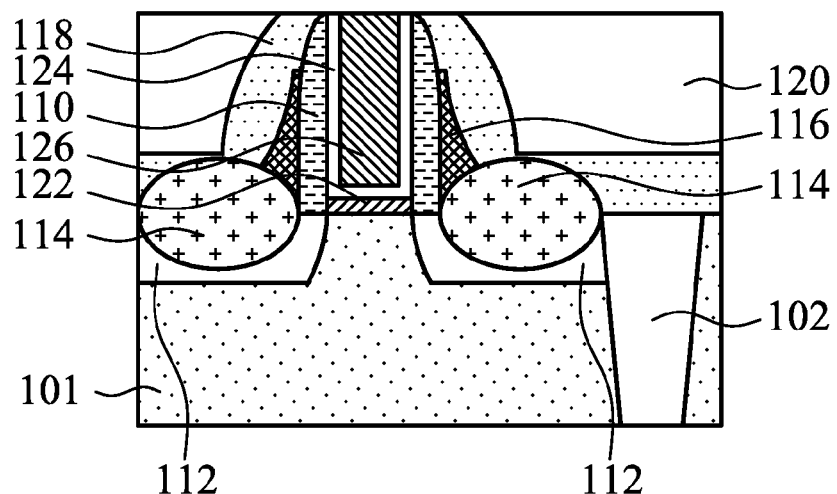
Figure 1E:
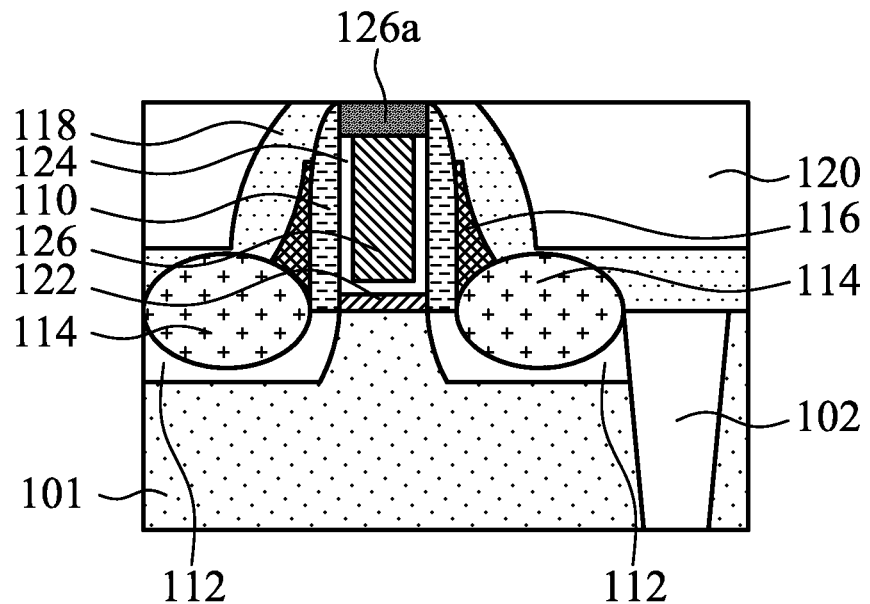
Figure 1F:
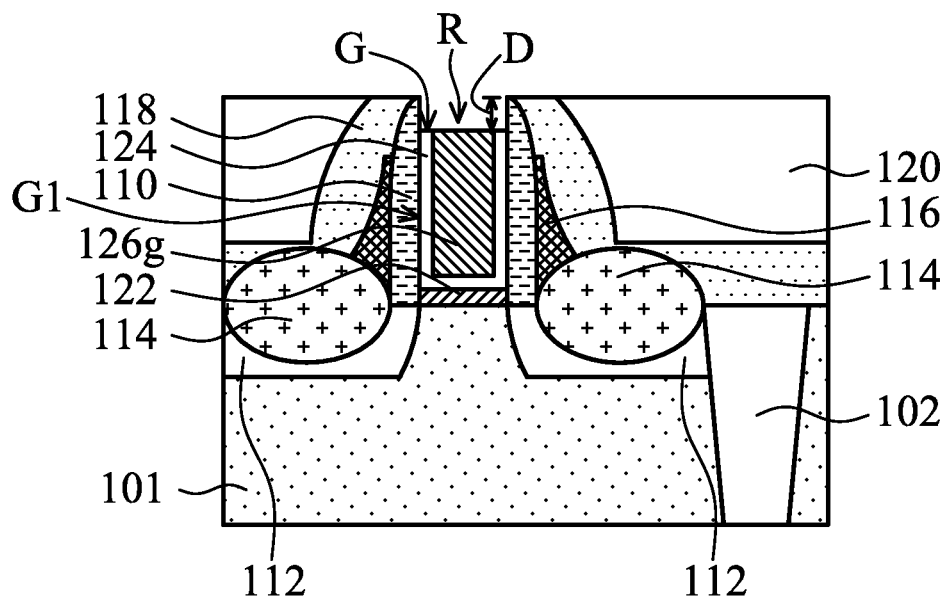
Figure 1G:
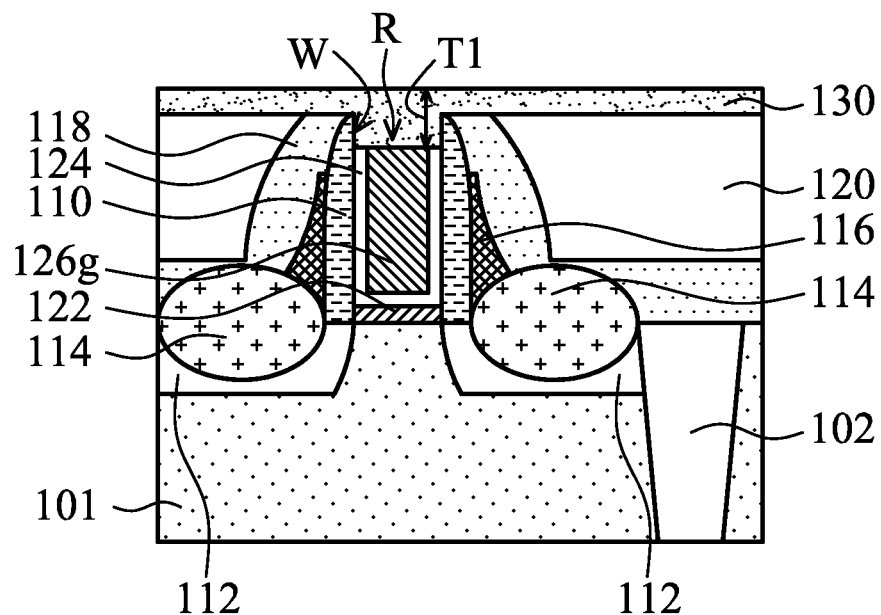
Figure 1H:
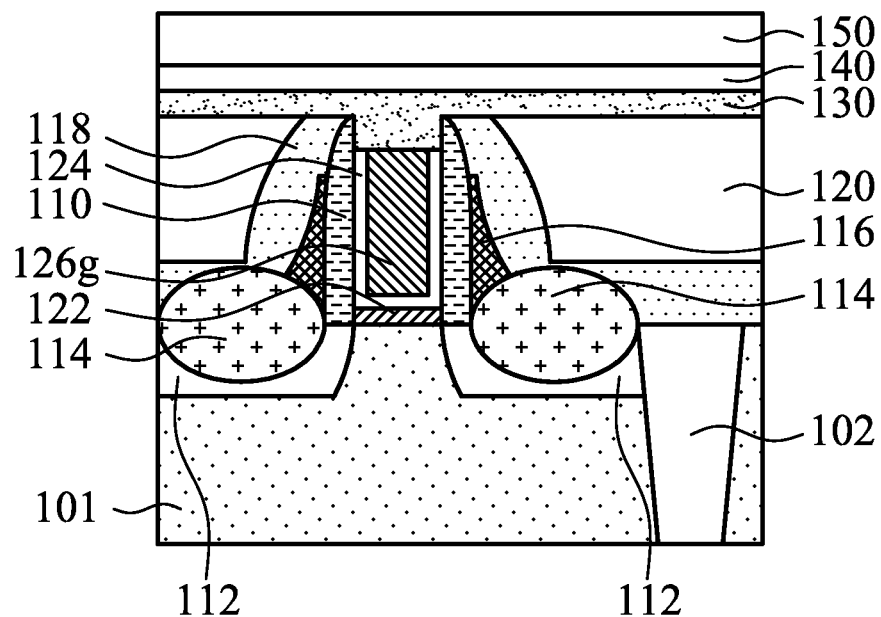
Figure 1I:
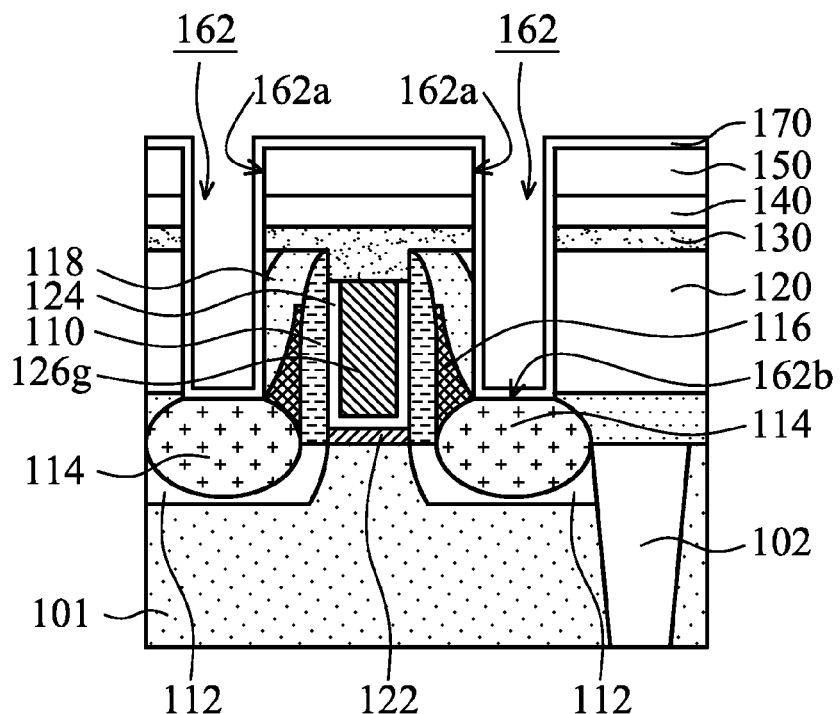
Figure 1J:
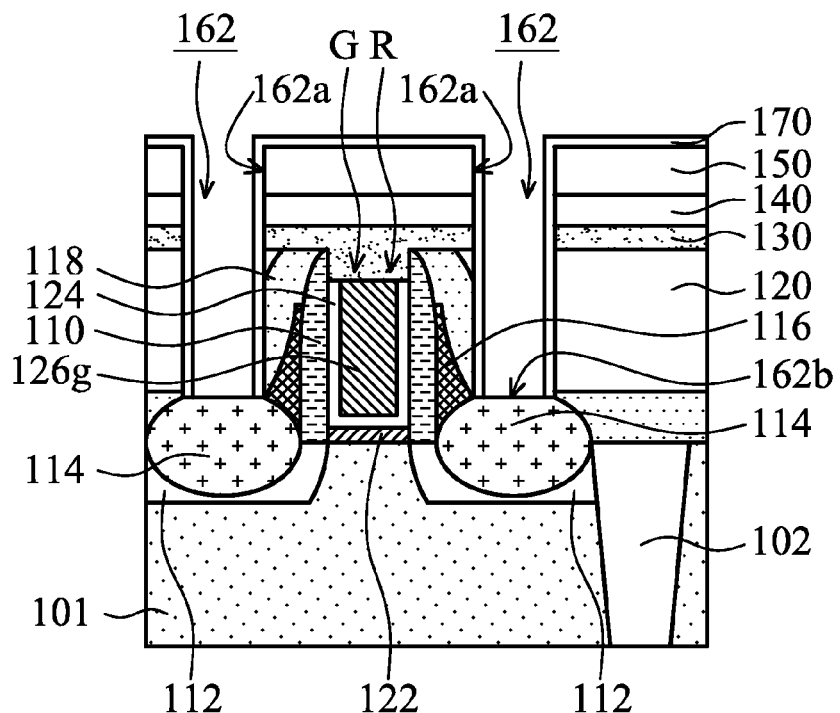
Figure 1K:
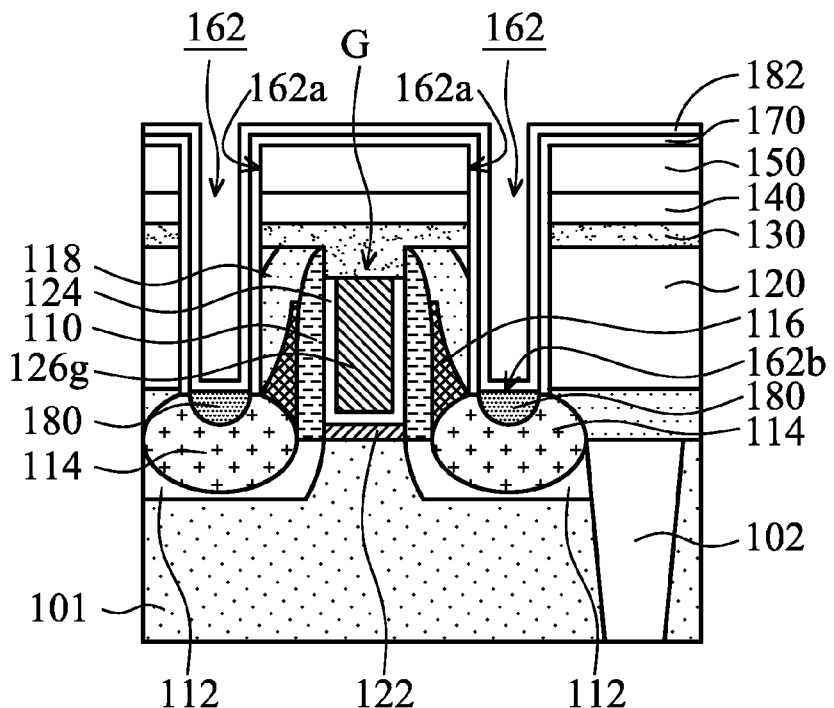
Figure 1L:
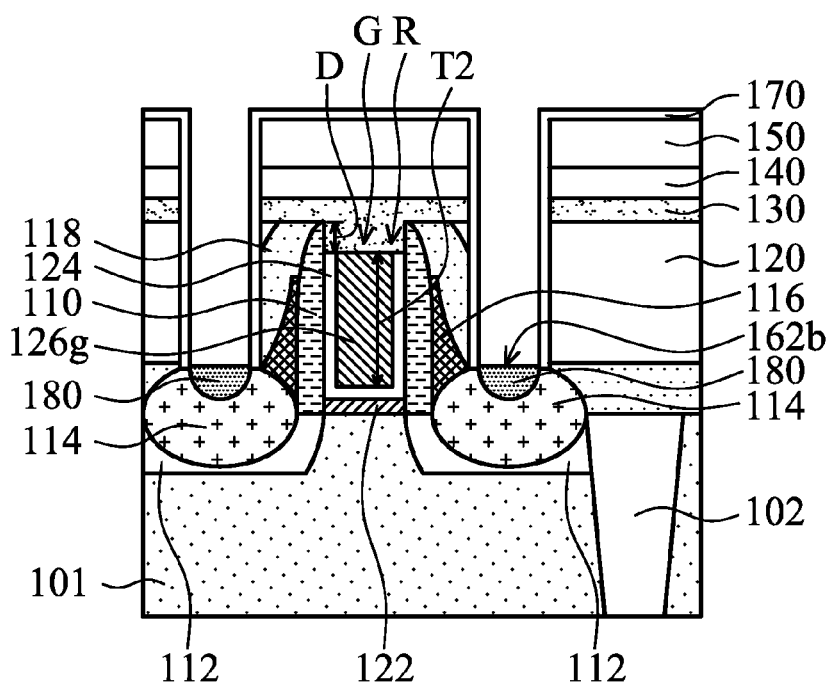
Figure 1M:
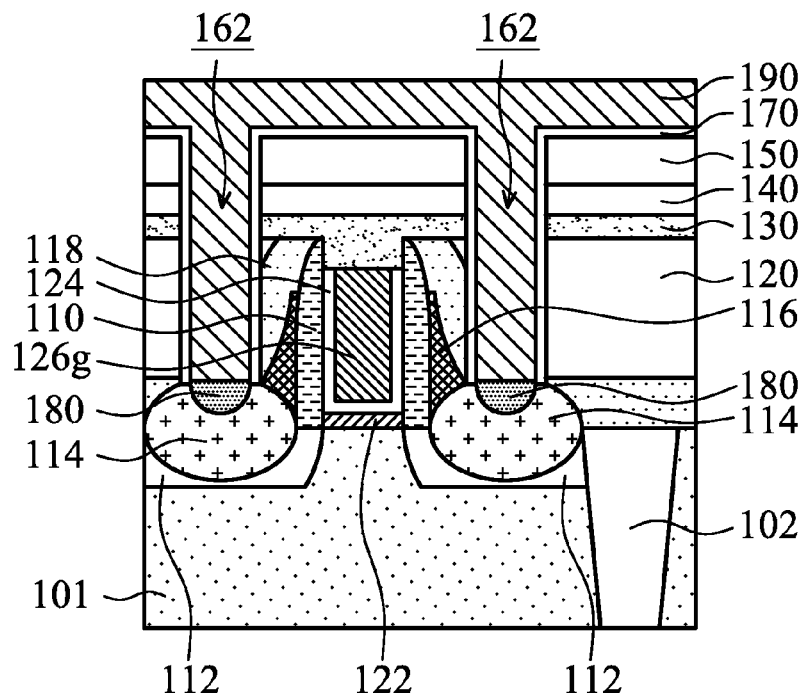
Figure 1N:
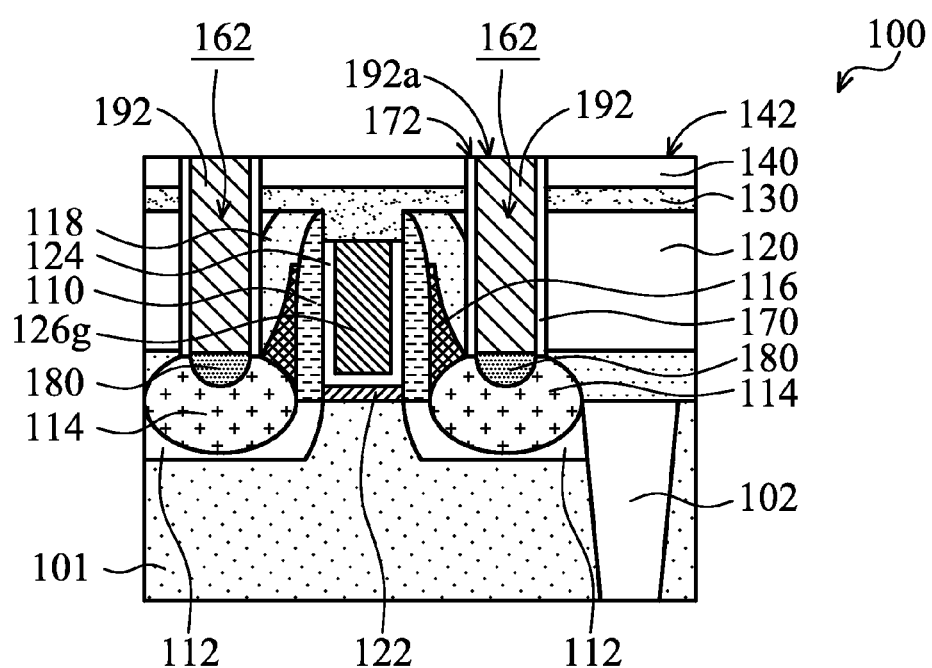

FIGS. 1A-1N are cross-sectional views of various stages of a process for forming a semiconductor device structure, in accordance with some embodiments. As shown in FIG. 1A, a semiconductor substrate 101 is provided. The semiconductor substrate 101 is a semiconductor wafer (such as a silicon wafer) or a portion of a semiconductor wafer, in accordance with some embodiments.

In some embodiments, the semiconductor substrate 101 is made of an elementary semiconductor material including silicon or germanium in a single crystal, polycrystal, or amorphous structure. In some other embodiments, the semiconductor substrate 101 is made of a compound semiconductor, such as silicon carbide, gallium arsenide, gallium phosphide, indium phosphide, indium arsenide, an alloy semiconductor, such as SiGe, or GaAsP, or a combination thereof. The semiconductor substrate 101 also includes multi-layer semiconductors, semiconductor-on-insulator (SOI) (such as silicon-on-insulator or germanium-on-insulator), or a combination thereof, in accordance with some embodiments.

As shown in FIG. 1A, an isolation structure 102 is formed in the semiconductor substrate 101 to define various active regions in the semiconductor substrate 101, and to electrically isolate neighboring devices (e.g. transistors) from one another. The isolation structure 102 is made of a dielectric material, such as silicon oxide, silicon nitride, silicon oxynitride, fluoride-doped silicate glass (FSG), a low-K dielectric material, other suitable materials, or a combination thereof, in accordance with some embodiments. The isolation structure 102 is formed by using an isolation technology, such as local oxidation of semiconductor (LOCOS), shallow trench isolation (STI), or the like, in accordance with some embodiments.

In some embodiments, the formation of the isolation structure 102 includes patterning the semiconductor substrate 101 by a photolithography process and etching a trench in the semiconductor substrate 101 (for example, by using a dry etching, wet etching, plasma etching process, or a combination thereof); and filling the trench (for example, by using a chemical vapor deposition process) with the dielectric material. In some embodiments, the filled trench has a multi-layer structure, such as a thermal oxide liner layer filled with silicon nitride or silicon oxide. However, in some other embodiments, the isolation structure 102 is not formed.

As shown in FIG. 1A, a gate dielectric layer 104 and a dummy gate 106 are formed over the semiconductor substrate 101 for defining active regions in the semiconductor substrate 101, in accordance with some embodiments. A gate-last approach or replacement-gate (RPG) approach will be subsequently performed to form a metal gate. The dummy gate 106 is made of polysilicon, in accordance with some embodiments.

The gate dielectric layer 104 serves as a dummy gate dielectric layer and is removed in a subsequent process, in accordance with some embodiments. The gate dielectric layer 104 is made of silicon oxide, in accordance with some embodiments. However, in some other embodiments, the gate dielectric layer 104 does not serve as a dummy gate dielectric layer and will not be subsequently removed. In these cases, the gate dielectric layer 104 is made of silicon oxide, silicon oxynitride, a high dielectric constant material (high-k material), or a combination thereof, in accordance with some embodiments.

As shown in FIG. 1A, spacers 110 are formed over sidewalls of the dummy gate 106. The spacers 110 are made of a dielectric material, such as silicon nitride, silicon oxynitride, or a combination thereof, in accordance with some embodiments. The structure of the spacers 110 shown in FIG. 1A is merely an example. Other configurations of the spacers 110 are also possible. For example, a sealing layer (not shown) is formed between the spacers 110 and the dummy gate 106.

As shown in FIG. 1A, doped regions 112 are formed in the semiconductor substrate 101, in accordance with some embodiments. The doped regions 112 are positioned at two opposite sides of the dummy gate 106, in accordance with some embodiments. The formation of the doped regions 112 includes an ion implantation process, in accordance with some embodiments. The doped regions 112 include a heavily doped source region and a heavily doped drain region, which are formed after the spacers 110 are formed, in accordance with some embodiments.

As shown in FIG. 1A, stressors 114 are formed in the doped regions 112 by using suitable processes, in accordance with some embodiments. The suitable processes include, for example, an etching process for removing a portion of the semiconductor substrate 101 and a selective epitaxial growth (SEG) process. Depending on the desired type of the resulting MOS device, either stressors applying a compressive stress to the channel region (such as SiGe stressors) or stressors applying a tensile stress to the channel region (such as SiC stressors) are formed.

As shown in FIG. 1A, spacer oxide layers 116 are formed over the spacers 110 and the stressors 114, in accordance with some embodiments. The formation of the spacer oxide layers 116 includes a chemical vapor deposition process, in accordance with some embodiments. The spacer oxide layers 116 fill the gaps between the spacers 110 and the stressors 114, in accordance with some embodiments.

The spacer oxide layers 116 are configured to facilitate films, which are subsequently formed, to cover the spacers 110 and the stressors 114 smoothly, in accordance with some embodiments. However, in some embodiments, the spacer oxide layers 116 are not formed.

As shown in FIG. 1A, a contact etch stop layer 118 is formed over the semiconductor substrate 101 and the dummy gate 106, in accordance with some embodiments. The contact etch stop layer 118 are made of a dielectric material, such as silicon nitride, in accordance with some embodiments. The contact etch stop layer 118 is formed over the spacers 110, the dummy gate 106, and the semiconductor substrate 101, in accordance with some embodiments. However, in some other embodiments, the contact etch stop layer 118 is not formed.

As shown in FIG. 1A, an insulating layer 120 is then deposited over the dummy gate 106 and the semiconductor substrate 101, in accordance with some embodiments. The insulating layer 120 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The insulating layer 120 is deposited by any suitable process, such as a CVD process, HDPCVD process, spin-on process, sputtering process, or a combination thereof, in accordance with some embodiments.

Afterwards, as shown in FIG. 1B, a planarization process, such as chemical mechanical polishing (CMP) or the like, is then performed on the insulating layer 120 until a top surface of the dummy gate 106 is exposed. After the planarization process is performed, the insulating layer 120 has a substantially planar top surface to facilitate subsequent process steps, in accordance with some embodiments.

Then, the dummy gate 106 is removed using a suitable process, such as a wet etching process, a dry etching process, or a combination thereof. In some embodiments, the gate dielectric layer 104 is also removed. After the dummy gate 106 and the gate dielectric layer 104 are removed, an opening 107 is formed between the spacers 110. The opening 107 is a trench, in accordance with some embodiments.

As shown in FIG. 1C, a gate dielectric layer 122 is formed to cover a bottom of the opening 107, in accordance with some embodiments. The gate dielectric layer 122 is made of a dielectric material, such as a high dielectric constant (high-k) material, in accordance with some embodiments.

The high-k material is made of hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof, in accordance with some embodiments.

The high-k material is further made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 122 is deposited by any suitable process, such as atomic layer deposition (ALD), chemical vapor deposition (CVD), physical vapor deposition (PVD), sputtering, plating, other suitable processes, or a combination thereof, in accordance with some embodiments. In some embodiments, the gate dielectric layer 122 needs to be further annealed.

In some embodiments, an intermediate dielectric layer (not shown) is formed over the semiconductor substrate 101 before the gate dielectric layer 122 is formed. The intermediate dielectric layer is made of a suitable dielectric material, such as silicon oxide, hafnium silicate, silicon oxynitride, or a combination thereof, in accordance with some embodiments.

As shown in FIG. 1C, a work function layer 124 is deposited over the insulating layer 120, the contact etch stop layer 118, the spacers 110, and the gate dielectric layer 122 in the opening 107, in accordance with some embodiments. The work function layer 124 provides a desired work function for transistors to enhance device performance including improved threshold voltage. The work function layer 124 is also referred to as a work function metal layer, in accordance with some embodiments.

In the embodiments of forming an NMOS transistor, the work function layer 124 can be an n-type metal capable of providing a work function value suitable for the device, such as a value that is equal to or less than about 4.5 eV. The n-type metal is made of metal, metal carbide, metal nitride, or a combination thereof, in accordance with some embodiments. For example, the n-type metal is made of tantalum, tantalum nitride, or a combination thereof.

On the other hand, in the embodiments of forming a PMOS transistor, the work function layer 124 can be a p-type metal capable of providing a work function value suitable for the device, such as a value that is equal to or greater than about 4.8 eV. The p-type metal is made of metal, metal carbide, metal nitride, other suitable materials, or a combination thereof, in accordance with some embodiments. For example, the p-type metal is made of titanium, titanium nitride, other suitable materials, or a combination thereof.

The work function layer 124 is made of hafnium, zirconium, titanium, tantalum, aluminum, metal carbides (e.g., hafnium carbide, or zirconium carbide), aluminides, ruthenium or a combination thereof, in accordance with some embodiments. The work function layer 124 is deposited by using a PVD process, CVD process, ALD process, plating process, another suitable method, or a combination thereof, in accordance with some embodiments.

As shown in FIG. 1C, a gate electrode layer 126 is deposited over the semiconductor substrate 101 and the work function layer 124 to fill the opening 107, in accordance with some embodiments. The gate electrode layer 126 is also referred to as a metal gate electrode layer, in accordance with some embodiments.

The gate electrode layer 126 is made of a suitable metal material, such as aluminum, tungsten, gold, platinum, cobalt, other suitable metal, alloy thereof, or a combination thereof, in accordance with some embodiments. The gate electrode layer 126 is deposited by using a PVD process, CVD process, plating process, the like, or a combination thereof, in accordance with some embodiments.

Afterwards, as shown in FIG. 1D, a planarization process is performed to remove the gate electrode layer 126 and the work function layer 124 outside of the opening 107, in accordance with some embodiments. The planarization process includes a chemical mechanical polishing (CMP) process or the like, in accordance with some embodiments.

As shown in FIG. 1E, a top portion of the gate electrode layer 126 is oxidized to convert the top portion into an oxide layer 126a, in accordance with some embodiments. In some embodiments, a top portion of the work function layer 124 is also oxidized when the top portion of the gate electrode layer 126 is oxidized. Therefore, the oxide layer 126a further includes the oxidized top portion of the work function layer 124, in accordance with some embodiments.

The top portion of the gate electrode layer 126 is oxidized in a thermal process using an oxygen-containing gas (such as $O_3$, $H_2O_2$, or $H_2O$), an ashing process using an oxygen-containing gas, a sputtering process using an oxygen gas, or another suitable oxidation method for oxidizing the top portion of the gate electrode layer 126.

As shown in FIG. 1F, the oxide layer 126a is removed, in accordance with some embodiments. The oxide layer 126a is removed using a wet etching process or a dry etching process, in accordance with some embodiments. The gate electrode layer 126 remaining over the gate dielectric layer 122 forms a gate electrode 126g, in accordance with some embodiments.

The gate electrode 126g, the work function layer 124, and the gate dielectric layer 122 together form a gate stack G (i.e., a metal gate stack), which is surrounded by the insulating layer 120. The spacers 110 are positioned over sidewalls G1 of the gate stack G, in accordance with some embodiments. After the removal of the oxide layer 126a, the gate electrode 126g (or the gate stack G) is recessed from the spacers 110, in accordance with some embodiments.

Therefore, a recess R surrounded by the spacers 110 and the gate electrode 126g (or the gate stack G) is formed, in accordance with some embodiments. In some other embodiments, the recess R is formed by using a dry etching process or a wet etching process to remove the top portion of the gate electrode layer 126 and without using the oxidation process.

In some embodiments, the recess R has a depth D. In some embodiments, the depth D of the recess R ranges from about 10 Å to about 50 Å. The work function layer 124 is positioned between the gate electrode 126g and the gate dielectric layer 122 and between the gate electrode 126g and the spacers 110, in accordance with some embodiments. The recess R is positioned over the work function layer 124, in accordance with some embodiments.

As shown in FIG. 1G, a cap layer 130 is formed to cover the insulating layer 120, the spacers 110, and the inner walls W of the recess R, in accordance with some embodiments. The cap layer 130 covers top surfaces of the insulating layer 120, the contact etch stop layer 118, the spacers 110, the work function layer 124, the gate electrode 126g, and the inner walls W of the recess R, in accordance with some embodiments.

The cap layer 130 includes oxide or nitride, in accordance with some embodiments. The cap layer 130 includes semiconductor oxide or metal oxide, in accordance with some embodiments. The cap layer 130 includes silicon oxide, aluminum oxide, or titanium oxide, in accordance with some embodiments. The cap layer 130 includes silicon nitride or silicon oxynitride, in accordance with some embodiments.

The cap layer 130 includes a dielectric material which has a strong adhesion with the insulating layer 120, the contact etch stop layer 118, the spacers 110, the work function layer 124, and/or the gate electrode 126g, in accordance with some embodiments. In some embodiments, the cap layer 130 and the insulating layer 120 are formed of the same material to ensure that the cap layer 130 has a strong adhesion with the insulating layer 120.

The cap layer 130 is formed by using a chemical vapor deposition (CVD) process, a physical vapor deposition (PVD) process, or an atomic layer deposition (ALD) process, in accordance with some embodiments. In some embodiments, a thickness T1 of the cap layer 130 ranges from about 100 Å to about 300 Å. The cap layer 130 is in direct contact with the insulating layer 120, the contact etch stop layer 118, the spacers 110, the work function layer 124, and/or the gate electrode 126g, in accordance with some embodiments. In some embodiments, the cap layer 130 fills the recess R.

As shown in FIG. 1H, an etch stop layer 140 (also called an insulating layer or a dielectric layer) is deposited over the cap layer 130, in accordance with some embodiments. The etch stop layer 140 is made of silicon nitride or other suitable materials. The etch stop layer 140 is deposited by using a chemical vapor deposition (CVD) process, a physical vapor deposition (PVD) process, or an atomic layer deposition (ALD) process, in accordance with some embodiments.

Referring again to FIG. 1H, a protective layer 150 is formed over the etch stop layer 140. The protective layer 150 is configured to protect the etch stop layer 140 from damage during a subsequent pre-amorphization implantation (PAI) process, in accordance with some embodiments. The protective layer 150 includes a plasma-enhanced oxide (PEOX) layer, in accordance with some embodiments.

Afterwards, as shown in FIG. 1I, the protective layer 150, the etch stop layer 140, the cap layer 130, the insulating layer 120, and the contact etch stop layer 118 are patterned to form contact openings 162 exposing the stressors 114, in accordance with some embodiments. A photolithography process and an etching process are used for patterning, in accordance with some embodiments.

Thereafter, as shown in FIG. 1I, a dielectric spacer liner (DSL) layer 170 is conformally formed over the protective layer 150 and the sidewalls 162a and the bottoms 162b of the contact openings 162, in accordance with some embodiments. The dielectric spacer liner layer 170 is configured to protect the sidewalls 162a from being damaged by the subsequent pre-amorphization implantation process.

The dielectric spacer liner layer 170 is made of, for example, SiOC or other suitable materials. The dielectric spacer liner layer 170 is formed by, for example, an atomic layer deposition process or other suitable processes. In some embodiments, the dielectric spacer liner layer 170 is in direct contact with the cap layer 130.

Afterwards, as shown in FIG. 1J, an etching process is performed to remove the dielectric spacer liner layer 170 over the bottoms 162b of the openings 162 so as to expose a portion of the stressors 114. The etching process includes a dry etching process (e.g., an argon plasma etching process), in accordance with some embodiments.

Afterwards, a cleaning process may be performed to clean the residues from the etching process of the dielectric spacer liner layer 170 over the bottoms 162b. The cleaning process includes, for example, an ammonia hydrogen peroxide mixture (APM) cleaning process using a cleaning solution containing $NH_4OH$, $H_2O_2$, and $H_2O$. Since the gate electrode 126g (or the gate stack G) is recessed from the spacers 110, the diffusion path for the cleaning solution to the gate electrode 126g is elongated, which prevents the cleaning solution from diffusing to and damaging the gate electrode 126g, in accordance with some embodiments.

A pre-amorphized implantation (PAI) process is performed to reduce the dopant channeling effect and enhance dopant activation, in accordance with some embodiments. In some embodiments, silicon, germanium or carbon is used. In some other embodiments, inert gases, such as neon, argon, krypton, xenon, and/or radon, are used.

The pre-amorphized implantation process prevents subsequently doped impurities from channeling through spaces within the crystal lattice structure and reaching depths greater than desired. Portions of the stressors 114 exposed and located at the bottoms 162b of the openings 162 are turned into an amorphous state as a result of the pre-amorphized implantation process.

Thereafter, as shown in FIG. 1K, a salicidation (self-aligned silicidation) process is performed to form metal silicide regions 180 on/in the stressors 114, in accordance with some embodiments. The salicidation process includes forming a metal layer 182 on the bottoms 162b of the openings 162 and the dielectric spacer liner layer 170; and performing a thermal process to convert a portion of the metal layer 182 and the stressors 114 contacting the metal layer 182 into the metal silicide regions 180, in accordance with some embodiments.

The metal silicide regions 180 are made of nickel silicide, in accordance with some embodiments. In some embodiments, the metal silicide regions 180 are made of a silicide material of a suitable metal material. The suitable metal material may be made of cobalt (Co), platinum (Pt), titanium (Ti), ytterbium (Yb), molybdenum (Mo), erbium (Er), or a combination thereof.

Thereafter, as shown in FIG. 1L, an un-reacted portion of the metal layer 182 is removed, in accordance with some embodiments. The un-reacted portion of the metal layer 182 is removed using an etching process, in accordance with some embodiments. The etching process includes a wet etching process, dry etching process, or a combination thereof, in accordance with some embodiments.

In some embodiments, a wet etching process is adopted to remove the un-reacted portion of the metal layer 182. An etchant, such as hot phosphoric acid, is used to remove the un-reacted portion of the metal layer 182, in accordance with some embodiments. Since the gate electrode 126g (or the gate stack G) is recessed from the spacers 110, the diffusion path for the etchant to the gate electrode 126g is elongated, which prevents the etchant from diffusing to and damaging the gate electrode 126g, in accordance with some embodiments.

In some embodiments, the gate electrode 126g has a thickness T2, in accordance with some embodiments. In some embodiments, a ratio (D/T2) of the depth D of the recess R to the thickness T2 ranges from about 0.05 to about 0.25. The ratio (D/T2) of the depth D to the thickness T2 is maintained in a proper range, in accordance with some embodiments.

If the ratio (D/T2) is too low, the depth D of the recess R is too small to effectively elongate the diffusion path for the etchant to the gate electrode 126g, in accordance with some embodiments. If the ratio (D/T2) is too large, the thickness T2 of the gate electrode 126g is too small, which adversely affects the electrical performance of the gate electrode 126g, in accordance with some embodiments.

As shown in FIG. 1M, a conductive layer 190 is deposited over the protective layer 150 and is filled into the openings 162 to electrically contact the metal silicide regions 180. The conductive layer 190 is formed by, for example, a PVD process or other suitable processes. The conductive layer 190 is made of, for example, tungsten or other suitable conductive materials.

As shown in FIG. 1N, the conductive layer 190 and the dielectric spacer liner layer 170 outside the openings 162 and the protective layer 150 are removed, in accordance with some embodiments. The removal process includes a chemical mechanical polishing (CMP) process, in accordance with some embodiments.

After the chemical mechanical polishing process, the conductive layer 190 remaining in the openings 162 forms contact plugs 192, in accordance with some embodiments. The contact plugs 192 penetrate through the etch stop layer 140, the cap layer 130, the insulating layer 120, and the contact etch stop layer 118, in accordance with some embodiments. The contact plugs 192 are electrically connected to the metal silicide regions 180 and the doped regions 112 (i.e. the S/D regions), in accordance with some embodiments.

After the chemical mechanical polishing process, top surfaces 142, 172 and 192a of the etch stop layer 140, the dielectric spacer liner layer 170, and the contact plugs 192 are coplanar with each other, in accordance with some embodiments. As shown in FIG. 1N, a semiconductor device structure 100 is formed. The semiconductor device structure 100 may be an n-type metal-oxide-semiconductor field-effect transistor (MOSFET) or a p-type MOSFET.

The semiconductor device structure 100 shown in FIG. 1N is an example for illustration. Some variations of the semiconductor device structure 100 are illustrated as follows.

Figure 2:
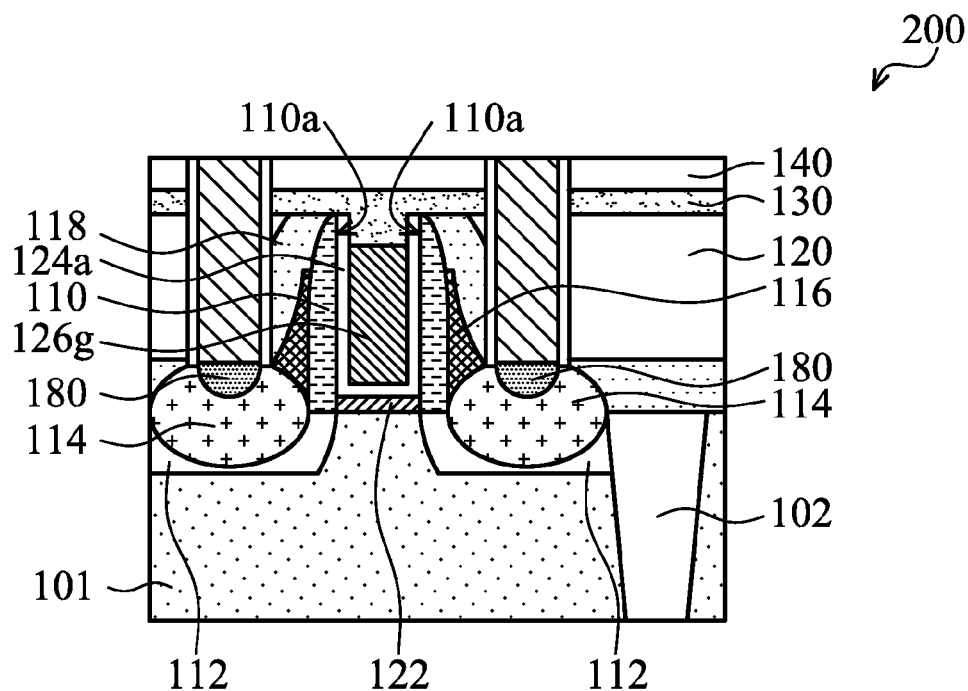
FIG. 2 is a cross-sectional view of a semiconductor device structure, in accordance with some embodiments.

FIG. 2 is a cross-sectional view of a semiconductor device structure, in accordance with some embodiments. As shown in FIG. 2, a semiconductor device structure 200 is similar to the semiconductor device structure 100 shown in FIG. 1N, except that the work function layer 124a of the semiconductor device structure 200 remains over the entire sidewalls 110a of the spacers 110. The gate electrode 126g is recessed from the work function layer 124a, in accordance with some embodiments.

Figure 3:
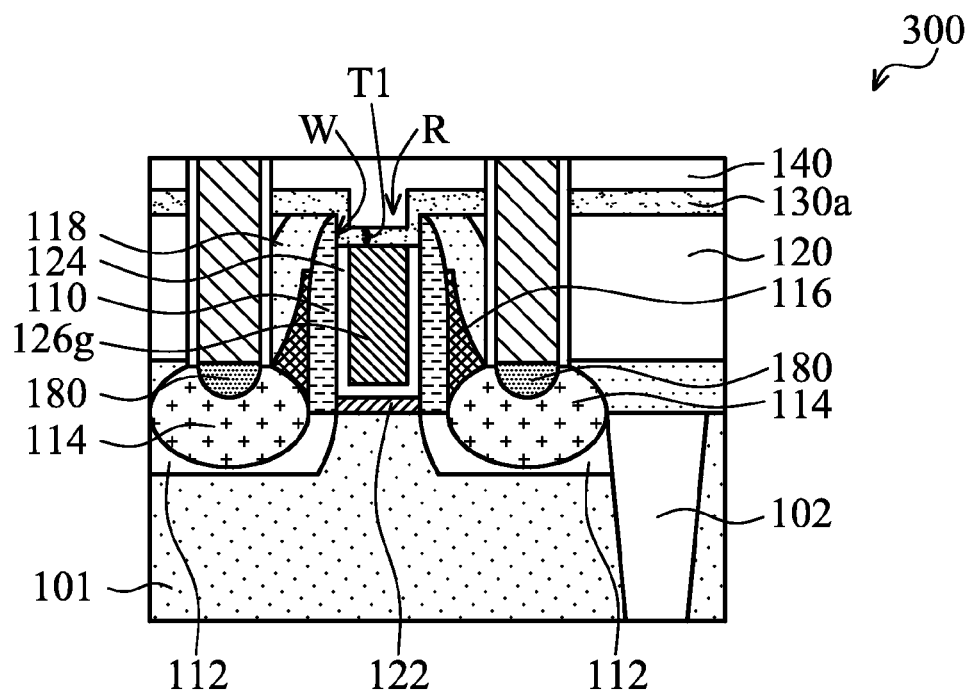
FIG. 3 is a cross-sectional view of a semiconductor device structure, in accordance with some embodiments.

FIG. 3 is a cross-sectional view of a semiconductor device structure, in accordance with some embodiments. As shown in FIG. 3, a semiconductor device structure 300 is similar to the semiconductor device structure 100 shown in FIG. 1N, except that the cap layer 130a of the semiconductor device structure 300 conformally covers the insulating layer 120, the spacers 110, and the inner walls W of the recess R, in accordance with some embodiments.

The cap layer 130a conformally covers the top surfaces of the insulating layer 120, the contact etch stop layer 118, the spacers 110, the work function layer 124, the gate electrode 126g, and the inner walls W of the recess R, in accordance with some embodiments. The thickness T1 of the cap layer 130a ranges from about 10 Å to about 50 Å, in accordance with some embodiments.

Figure 4:
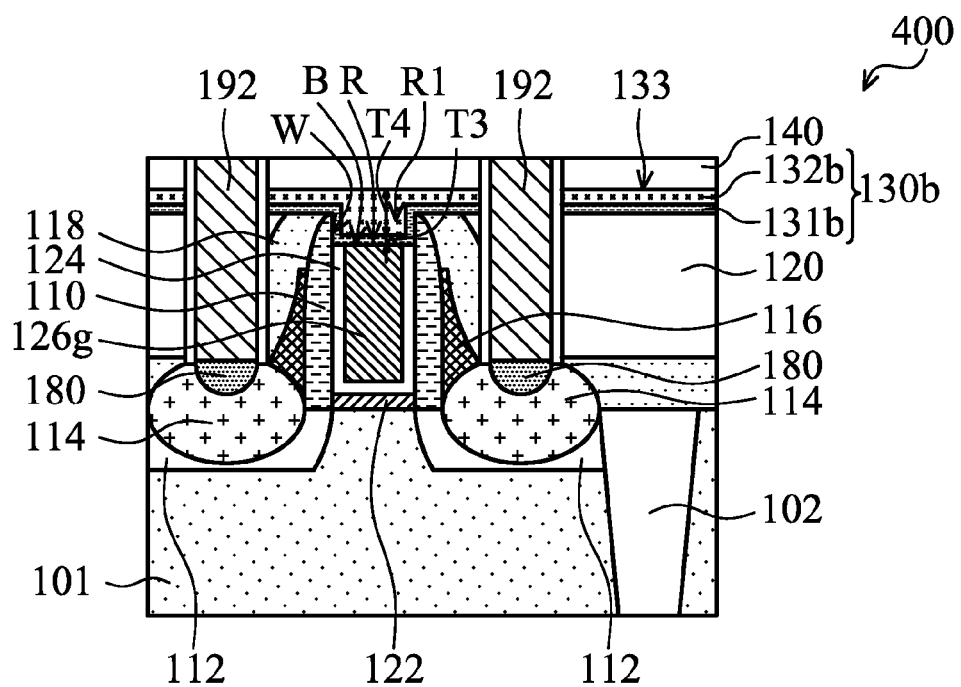
FIG. 4 is a cross-sectional view of a semiconductor device structure, in accordance with some embodiments.

FIG. 4 is a cross-sectional view of a semiconductor device structure, in accordance with some embodiments. As shown in FIG. 4, a semiconductor device structure 400 is similar to the semiconductor device structure 100 shown in FIG. 1N, except that the cap layer 130b of the semiconductor device structure 400 has a first layer 131b and a second layer 132b over the first layer 131b, in accordance with some embodiments.

The first layer 131b conformally covers the insulating layer 120 and the inner walls W and the bottom surface B of the recess R, in accordance with some embodiments. The first layer 131b conformally covers the top surfaces of the insulating layer 120, the contact etch stop layer 118, the spacers 110, the work function layer 124, the gate electrode 126g, and the inner walls W of the recess R, in accordance with some embodiments.

The second layer 132b fills a recess R1 of the first layer 131b positioned in the recess R, in accordance with some embodiments. The second layer 132b has a substantially flat top surface 133, in accordance with some embodiments. A thickness T3 of the first layer 131b is less than a thickness T4 of the second layer 132b, in accordance with some embodiments.

The first layer 131b includes metal oxide to have a strong adhesion with the gate electrode 126g, in accordance with some embodiments. The second layer 132b and the etch stop layer 140 are formed of the same material such that the second layer 132b has a strong adhesion with the etch stop layer 140, in accordance with some embodiments. The second layer 132b and the etch stop layer 140 are formed of nitride, in accordance with some embodiments.

Figure 5:
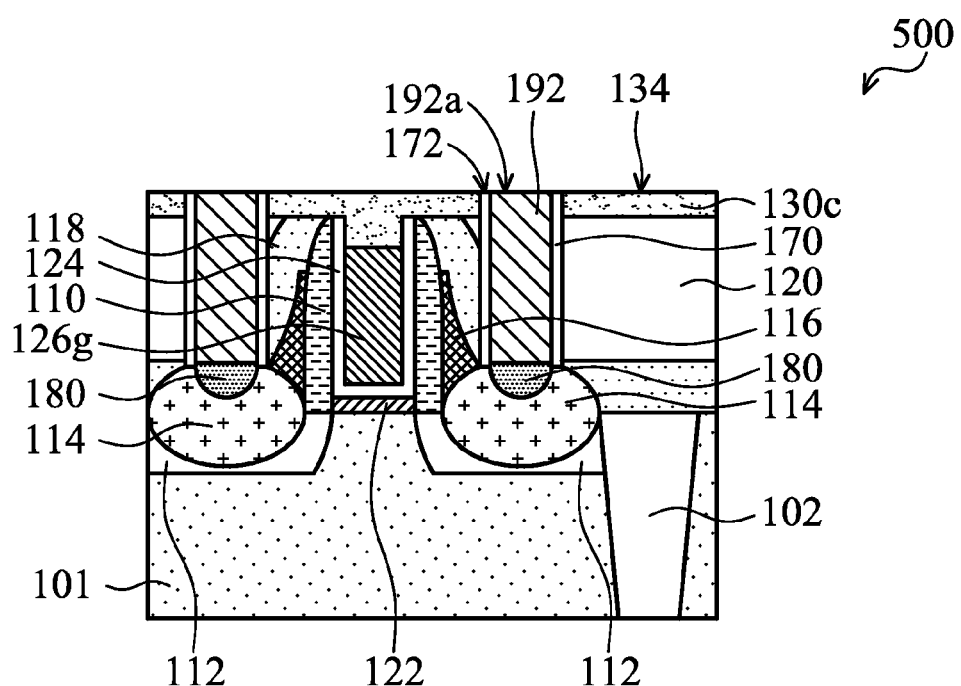
FIG. 5 is a cross-sectional view of a semiconductor device structure, in accordance with some embodiments.

FIG. 5 is a cross-sectional view of a semiconductor device structure, in accordance with some embodiments. As shown in FIG. 5, a semiconductor device structure 500 is similar to the semiconductor device structure 100 shown in FIG. 1N, except that the cap layer 130c also functions as an etch stop layer, in accordance with some embodiments.

Therefore, there is no need to form an etch stop layer over the cap layer 130c, in accordance with some embodiments. The top surfaces 134, 172, and 192a of the cap layer 130c, the dielectric spacer liner layer 170, and the contact plugs 192 are aligned with each other, in accordance with some embodiments.

In accordance with some embodiments, semiconductor device structures and methods for forming the same are provided. The methods (for forming the semiconductor device structure) form a gate electrode recessed from spacers to elongate a diffusion path for an etchant (used to form contacts) to the gate electrode, which prevents the etchant from diffusing to and damaging the gate electrode. Therefore, the yield of the semiconductor device structure is improved.

In accordance with some embodiments, a semiconductor device structure is provided. The semiconductor device structure includes a semiconductor substrate. The semiconductor device structure includes a gate stack positioned over the semiconductor substrate. The gate stack includes a gate dielectric layer and a gate electrode over the gate dielectric layer. The semiconductor device structure includes spacers positioned over first sidewalls of the gate stack. The spacers and the gate stack surround a recess. The semiconductor device structure includes an insulating layer formed over the semiconductor substrate and surrounding the gate stack. The semiconductor device structure includes a cap layer covering the insulating layer, the spacers, and inner walls of the recess.

In accordance with some embodiments, a semiconductor device structure is provided. The semiconductor device structure includes a semiconductor substrate. The semiconductor device structure includes a gate stack formed over the semiconductor substrate. The gate stack includes a gate dielectric layer and a gate electrode over the gate dielectric layer. The semiconductor device structure includes spacers positioned over sidewalls of the gate stack. The spacers and the gate stack surround a recess. The semiconductor device structure includes an insulating layer formed over the semiconductor substrate and surrounding the gate stack. The semiconductor device structure includes a cap layer positioned over the insulating layer and extending into the recess to fill the recess.

In accordance with some embodiments, a method for forming a semiconductor device structure is provided. The method includes forming a gate stack, spacers, and an insulating layer over a semiconductor substrate. The gate stack includes a gate dielectric layer and a gate electrode layer over the gate dielectric layer. The spacers are formed over first sidewalls of the gate stack. The insulating layer surrounds the gate stack. The method includes removing a top portion of the gate electrode layer, such that the gate electrode layer remaining over the gate dielectric layer forms a gate electrode, and a recess surrounded by the spacers and the gate electrode is formed. The method includes forming a cap layer over the insulating layer, the spacers, and inner walls of the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a semiconductor substrate;
a gate stack positioned over the semiconductor substrate, wherein the gate stack comprises a gate dielectric layer and a gate electrode over the gate dielectric layer;

spacers positioned over first sidewalls of the gate stack, wherein the spacers and the gate stack surround a recess;
an insulating layer formed over the semiconductor substrate and surrounding the gate stack;
a cap layer covering the insulating layer, the spacers, and inner walls of the recess, wherein the cap layer is located above a top of the insulating layer, and the cap layer comprises a dielectric material; and
a work function metal layer between the gate electrode and the gate dielectric layer, between the gate electrode and the spacers, and between the cap layer in the recess and the spacers.

2. The semiconductor device structure as claimed in claim 1, wherein the cap layer in the recess is separated from the spacers by the work function metal layer.

3. The semiconductor device structure as claimed in claim 1, wherein the cap layer comprises oxide or nitride.

4. The semiconductor device structure as claimed in claim 1, wherein the cap layer conformally covers the inner walls and a bottom surface of the recess.

5. The semiconductor device structure as claimed in claim 1, further comprising:
an etch stop layer positioned over the cap layer.

6. The semiconductor device structure as claimed in claim 1, wherein the cap layer has a first layer and a second layer over the first layer.

7. The semiconductor device structure as claimed in claim 6, wherein the first layer conformally covers the insulating layer and the inner walls and a bottom surface of the recess, and the first layer has a first recess in the recess, and the second layer fills the first recess.

8. The semiconductor device structure as claimed in claim 1, wherein the semiconductor substrate has a source region and a drain region positioned at two opposite sides of the gate stack, respectively, and the semiconductor device structure further comprises:
contact plugs penetrating through the cap layer and the insulating layer to electrically connect to the source region and the drain region, respectively, wherein first top surfaces of the contact plugs are aligned with a second top surface of the cap layer.

9. A semiconductor device structure, comprising:
a semiconductor substrate;
a gate stack formed over the semiconductor substrate, wherein the gate stack comprises a gate dielectric layer and a gate electrode over the gate dielectric layer;
spacers positioned over sidewalls of the gate stack, wherein the spacers and the gate stack surround a recess;
an insulating layer formed over the semiconductor substrate and surrounding the gate stack;
a cap layer positioned over a top of the insulating layer and extending into the recess to fill the recess, wherein the cap layer comprises a dielectric material; and
a work function metal layer between the gate electrode and the gate dielectric layer, between the gate electrode and the spacers, and between the cap layer in the recess and the spacers.

10. The semiconductor device structure as claimed in claim 9, wherein the cap layer outside of the recess is in direct contact with the spacers.

11. The semiconductor device structure as claimed in claim 9, wherein the cap layer comprises oxide or nitride.

12. The semiconductor device structure as claimed in claim 9, wherein the cap layer has a first layer and a second layer over the first layer, a first thickness of the first layer is less than a second thickness of the second layer, the first layer conformally covers the insulating layer and the inner walls and a bottom surface of the recess, the first layer has a first recess in the recess, and a portion of the second layer fills the first recess.

13. The semiconductor device structure as claimed in claim 12, further comprising:
an etch stop layer positioned over the second layer, wherein the gate electrode is a metal gate electrode, the first layer comprises metal oxide, and the second layer and the etch stop layer are made of nitride.

14. The semiconductor device structure as claimed in claim 13, wherein the semiconductor substrate has a source region and a drain region positioned at two opposite sides of the gate stack, respectively, and the semiconductor device structure further comprises:
contact plugs penetrating through the first layer, the second layer, and the insulating layer to electrically connect to the source region and the drain region, respectively.

15. The semiconductor device structure as claimed in claim 9, wherein the semiconductor substrate has a source region and a drain region positioned at two opposite sides of the gate stack, respectively, and the semiconductor device structure further comprises:
contact plugs penetrating through the cap layer and the insulating layer to electrically connect to the source region and the drain region, respectively, and first top surfaces of the contact plugs are aligned with a second top surface of the cap layer.

16. The semiconductor device structure as claimed in claim 1, wherein the recess has a depth, the gate electrode has a thickness, and a ratio of the depth to the thickness ranges from about 0.05 to about 0.25.

17. The semiconductor device structure as claimed in claim 7, further comprising:
an etch stop layer positioned over the second layer, wherein the gate electrode is a metal gate electrode, the first layer comprises metal oxide, and the second layer and the etch stop layer are made of nitride.

18. The semiconductor device structure as claimed in claim 8, wherein the semiconductor device structure further comprises:
stressors formed in the source region and the drain region, respectively.

19. The semiconductor device structure as claimed in claim 9, wherein the cap layer in the recess is separated from the spacers by the work function metal layer.

20. The semiconductor device structure as claimed in claim 15, wherein the semiconductor device structure further comprises:
stressors formed in the source region and the drain region, respectively.

* * * * *